United States Patent
Joshi et al.

[11] Patent Number: 5,805,431
[45] Date of Patent: Sep. 8, 1998

[54] SURFACE MOUNTABLE TRANSFORMER

[75] Inventors: Shankar R. Joshi, Elmont, N.Y.; Meta Rohde, Upper Saddle River, N.J.

[73] Assignee: Synergy Microwave Corporation, Paterson, N.J.

[21] Appl. No.: 588,074

[22] Filed: Jan. 17, 1996

[51] Int. Cl.$^6$ .............................. H01F 27/30; H01F 27/04
[52] U.S. Cl. ......................... 361/836; 361/743; 361/782; 361/811; 361/812; 336/90; 336/192; 439/931; 174/52.1; 174/65 R
[58] Field of Search .................................... 361/728, 790, 361/736, 743, 782, 733, 811, 812, 821, 836; 336/90, 192; 174/52.1, 65 R; 439/563, 566, 570, 931

[56] References Cited

U.S. PATENT DOCUMENTS

| | | | |
|---|---|---|---|
| 2,169,708 | 8/1939 | O'Callaghan | 361/811 |
| 3,750,069 | 7/1973 | Renskers | 336/192 |
| 3,972,663 | 8/1976 | Taniguchi | 425/125 |
| 4,425,702 | 1/1984 | Murakami et al. | 29/606 |
| 4,443,777 | 4/1984 | Koike | 336/192 |
| 4,628,148 | 12/1986 | Endou | 174/52.4 |
| 5,023,768 | 6/1991 | Collier | 336/185 |
| 5,160,907 | 11/1992 | Nakajima et al. | 361/782 |
| 5,222,850 | 6/1993 | Medal | 411/82 |
| 5,347,245 | 9/1994 | Wright, Jr. | 333/131 |
| 5,440,225 | 8/1995 | Kojima | 323/359 |

FOREIGN PATENT DOCUMENTS

| | | | |
|---|---|---|---|
| 40 07 614 A1 | 9/1990 | Germany | H01F 17/06 |
| 63-78510 A | 4/1988 | Japan | 336/90 |
| 3-198311 | of 1989 | Japan | H01F 40/10 |
| 3-60107 | of 1989 | Japan | H01F 40/04 |
| 5-283248 | of 1992 | Japan | H01F 31/00 |
| 5-304033 | of 1992 | Japan | H01F 31/00 |
| 6-112065 | of 1992 | Japan | H01F 31/00 |
| 6-124834 | of 1992 | Japan | H01F 15/10 |
| 7-142265 | of 1993 | Japan | H01F 27/32 |
| 6-61055 A | 3/1994 | Japan | 336/192 |

OTHER PUBLICATIONS

Stetco Inc. entitled "Inductors" 1994.
Toko entitled "Coils & Filters" 1993 (CF–1–Coilcat).
Toko, Oct. 1991.
Pico Electronics, Inc., Catalog 2025, 1995.

*Primary Examiner*—Leo P. Picard
*Assistant Examiner*—John B. Vigushini
*Attorney, Agent, or Firm*—Lerner, David, Littenberg, Krumholz & Mentlik

[57] ABSTRACT

A surface mount package particularly suitable for transformers and other components having numerous windings of fragile, difficult to handle wire has a housing which includes openings along the lower edge, the housing being plated with an electrically conductive material on portions of the lower edge and in areas surrounding the opening. A component is held within the housing, and the leads of the component are disposed in the openings at a point above the lower edge of the housing, and the leads are electrically connected to the plating surrounding the openings and the plating at the flat portions of the lower edge. The plating on the flat portions of the lower edge can be at any suitable location, i.e., remote from or adjacent to the openings. Additional components can be stacked on the exterior of the housing, as connected to the plating surrounding the openings. Also, the walls and/or the top of the housing can be plated to provide for versatility in connecting the housed component, or any other components, on and around the housing. The plating on the housing may be connected to the plating surrounding the openings and the plating at the flat portions of the lower edge, or may entirely independent of the housed electronic component.

35 Claims, 5 Drawing Sheets

SURFACE MOUNTABLE TRANSFORMER

BACKGROUND OF THE INVENTION

The present invention relates generally to packages for housing electronic components, and more particularly to packages which are adapted to be surface mounted on a printed circuit board or other substrate. While the present invention is particularly suitable for use with components with windings of delicate, difficult to handle wires, it is applicable to the packaging of any electronic component or group of components.

The handling of small electronic components has always been a problem since they are easily damaged and the small leads of many such components are difficult to manipulate. This problem is becoming more prevalent as components are further miniaturized. This is particularly true of components which have delicate wires which must be electrically connected to transmission lines, circuits or other components on or associated with a substrate. The delicate wires of such components can be damaged when being handled by nicks in the wires or even by the oils from the operator's hand. Moreover, components of this type, including transformers and coils, are shrinking in size as required by more advanced applications and as the "real estate" on PC boards becomes more valuable.

The manufacture of the component is a difficult enough task because of the miniature size of these components. The challenge beyond the manufacture of these components is protecting these components against damage and enabling these components to be mounted more quickly and with less risk of damage. By way of example, in high volume production, pick and place operations using robotic arms and other intricate machinery are often used to marry the component to another component on a PC board. Coils and chokes in their normal form are not suitable for pick and place operations in high volume production. It is difficult to handle delicate, miniaturized components in these operations. Thus, those in the industry have attempted to manufacture the components in a more secure manner and/or package the components within enclosures or partial enclosures to facilitate the handling of delicate components without the risk of damage.

The art includes the packaging of transformers and coils in an enclosure having a top, side walls and feet extending from the bottom of the side walls. The transformers are placed in the enclosure and a length of a lead is wrapped around a foot of the enclosure or is soldered to the foot, or a clip-on structure is used to secure the wire to the foot. These arrangements require longer lengths of wire, and the component itself is not fully stabilized within the housing (partially by reason of the long length of wire often required). Other arrangements include cores/bobbins around which windings are placed. The bobbins have legs on either side of the wound wire, and the wires are soldered to the bottom of the legs. This type of an arrangement provides little flexibility for the use of the component itself and is difficult to manufacture. Further, additional protective measures, such as an enclosure, may be required to protect the delicate wires.

The present invention overcomes many of the shortcomings of the above-discussed components. The present invention provides for the packaging of delicate components, whereby the component can be stabilized within an enclosure, the component can be protected such that the oils of an operator's hand do not affect performance and protected against nicks in the wires which could also affect performance, the component can be insulated from other components, shorter lengths of wire can be used between the enclosure wall and the component, the wires can be maintained at a uniform length by virtue of the spacing (thus providing for repeatability), the enclosure is surface mountable, and the package has tremendous versatility in that it can be used to fulfill standard applications or customized to fulfill specialized applications.

SUMMARY AND OBJECTS OF THE INVENTION

The present invention relates more specifically to a surface mount package including a housing which has an interior for receiving an electronic component and has a wall made of a dielectric material and having a bottom edge at which an opening is provided for receiving a lead from a component housed within a housing. The housing also includes a flat lower edge, the flat lower edge having at least one portion which is plated with a conductive material. Within the package, there is at least one electronic component which includes a lead, and that lead is electrically connected to the conductive material at the flat lower edge of the housing. The connection between the lead and the conductive material at the flat lower edge is made such that the flat lower edge can rest flush on a substrate such as a PC board. When the package is surface mounted on a PC board, the housed component can be electrically connected to a circuit or components on the PC board.

The flat lower edge which is plated may be provided at several points, depending upon how the package will be connected to a PC board. In this regard, the bottom edge of the wall may be entirely flat, and only portions of that bottom edge are plated to provide for the electrical connection of the component housed within the housing to the PC board. The plating at the flat lower edge may be remote from or adjacent to the opening. If remote from the opening, there is plating, preferably surface plating, provided between the opening and the flat lower edge, and to the plated flat lower edge. The plating provided at the flat lower edge may be accomplished by surface plating or by a clip. The clip may be attached to the housing in the area of the opening or to cover at least a portion of the opening, and the clip may include a stop which leaves exposed a portion of the opening for the lead component. The clip may also include a foot which extends outwardly to facilitate the inspection of the soldered joint between the package and a PC board. Similarly, the bottom of the wall of the housing may include a small foot, a portion of which is plated and provides at least a portion of the flat lower edge.

The package may also include plating, preferably surface plating, on the walls and/or top for integrating other components or circuits with the housed component, or for use independently of the housed component (merely to save real estate on a PC board). Circuits can be developed from this surface plating, and components may be stacked on the wall or top of the housing.

The housing is preferably sized so that a component will be held within the housing and stabilized with respect to the housing and its leads by an interference fit. Other modes of holding and stabilizing the component can also be practiced. In some cases, the connection of the leads of a component within the slots of the housing may be enough stabilization. In other instances, an adhesive may be used or some structure within the housing which will cooperate with the structure of the component may be used. Also, the component may be partially or fully encapsulated within the housing, this encapsulation providing insulation, as well as stabilization.

Any component may be housed within the housing in accordance with the present invention to provide a package in connection with the present invention. The present invention is well suited for all components, but is particularly suited for components having windings or coils of delicate wire. Transformers and other coil-type devices fall into this latter category. Of course, the package may contain more than one component, and may in fact include a circuit.

The present invention is also directed to a surface mountable component housing and a method of manufacturing such a surface mountable component housing. The method includes the steps of providing a housing having an interior and a wall, the wall being made of a dielectric material and having a bottom edge. The housing has a flat lower edge. An opening is to formed at the bottom edge of the wall, and at least a portion of the flat lower edge is to be plated with an electrically conductive material such that the formation of the opening and the plating at the flat lower edge is accomplished in such a way that when an electronic component is disposed in the interior of the housing, a lead from that electronic component can be electrically connected to the plating at the flat lower edge of the housing such that the flat lower edge of the housing can rest flush on a PC board or other substrate. As discussed above, the flat lower edge can be adjacent to or remote from the opening, and the plating can be of any suitable type as discussed herein. The surface mountable component housing in accordance with the present invention is essentially the housing resulting from the method of manufacturing.

The present invention is also directed to the method of manufacturing a surface mountable package, which includes the steps of providing a housing having an interior and a wall, the wall being made of a dielectric material and having a bottom edge and an opening. The housing has a flat lower edge which is plated with an electrically conductive material. As set forth above, the flat lower edge need not be entirely plated, as only a portion of the same, depending upon the size of the flat lower edge, needs to be plated for surface mounting. An electronic component having a lead is then provided, and the housing and electronic component are arranged with respect to one another such that the lead of the component is aligned with the opening and wall of the housing. The electronic component is inserted into the interior of the housing, and the lead of the electronic component is positioned in the opening. The lead is then electrically connected to the plated flat lower edge such that the plated flat lower edge can rest flush on a substrate and the electronic component can be electrically connected to a circuit or component on a PC board or other substrate. This method may also include the steps of stabilizing the component within the interior of the housing, and this can be accomplished in many ways, including those discussed herein.

The present invention also relates to providing a housing as discussed above, but the housing in accordance with this aspect of the present invention can be constructed with or without the openings in the wall at the bottom edge of the wall. Here, the walls and/or top are plated, preferably surface plated, to provide the efficient use of the real estate of a PC board. Components may be connected to the housed component or other components on the PC board or other substrate using the plating on the wall and/or top.

It is an object of the present invention to provide an electronic component package which is surface mountable and contains a component or components, where the leads of the component or components are disposed in openings extending to the bottom edge of a housing wall, at least a portion of the bottom edge being plated with a conductive material which is electrically connected to the lead of the component.

It is another object of the present invention to provide an enclosure for an electronic component in which the component or a group of components are stabilized with respect to the enclosure and the leads of the component, the leads being electrically connected to plating on the lower edge of the enclosure.

It is another object of the present invention to provide an enclosure which can be used to package a component or group of components, the enclosure including an opening extending to the lower edge of the enclosure and the surrounding portions and at least one portion of the lower edge being plated with an electrically conductive material.

It is another object of the present invention to provide an enclosure having openings, preferably in the form of slots, that extend to the bottom edge of the enclosure wall, and including means for raising the enclosure for solder joint inspection, such means being a thickened area or areas of surface plating, a clip or clips (including lead frames) or any other suitable means; and whereby such means may also serve to provide an electrical connection from a component lead disposed in an opening to a PC board by providing a conductive surface at a lower edge of an enclosure wall.

It is another object of the present invention to provide a versatile electronic component package which includes an enclosure around which components other than the housed component can be stacked and/or integrated with a series of transmission lines and/or other platings, such platings being either independent of the component and slots in the enclosure or being connected to one or more of the leads of the housed component and/or the plated slots of the enclosure.

It is another object of the present invention to provide a technique by which electronic component packages can be manufactured with ease and with less chance of damage to the component.

BRIEF DESCRIPTION OF THE DRAWINGS

The foregoing and other objects of the present invention will become apparent, as will a better understanding of the concepts underlying the present invention, by reference to the description which follows and refers to the accompanying drawings in which.

DETAILED DESCRIPTION

Figure 1:
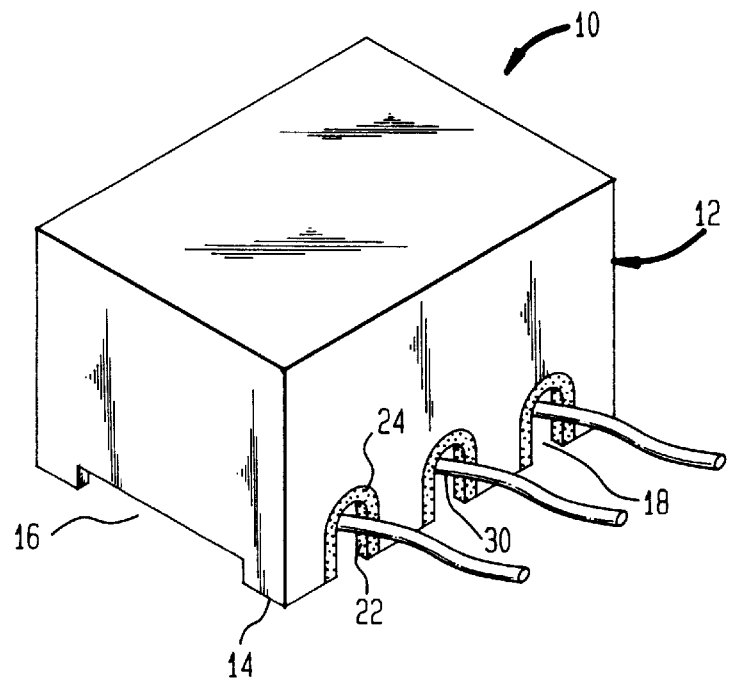
FIG. 1 is a perspective view of a surface mountable transformer package in accordance with the present invention.

Referring to the figures, FIG. 1 shows a surface mount package generally designated as 10 in accordance with the present invention. The package 10 includes a housing 12, which in the preferred embodiment is essentially a box with no bottom, though the housing 12 can take on any suitable form given the nature of the present invention. For example, the housing 12 may be in the shape of a ring which includes no top or bottom, or may include a bottom as a heat sink. (The use of terms such as "vertical", "lower", "top", "bottom", "below" or "above" are not intended to limit the manner in which the present invention may be practiced and are only being used to facilitate the description of the present invention.)

In the illustrated embodiment, the housing 12 has a wall with four side portions (or four connected walls) and a top, but no bottom. The bottom of the housing is open and reveals the interior defined by the wall and the top. The bottom opening is defined by a lower edge 14. At least portions of lower edge 14 are flat so that when the package 10 is connected to a substrate (a PC board or the like), the flat portions of the lower edge 14 rest flush on the substrate. As will be described in more detail below, it is these flat portions, or at least one of such flat portions, which carry the conductive material permitting the package 10 to be surface mountable. The lower edge 14 may also include, as shown in FIG. 1, a raised portion defining a horizontal opening 16. This permits for the circulation of air, which may be desirable in certain applications.

The housing 12, or at least the wall thereof, is preferably made of a dielectric material, such as plastic or ceramic. Ceramic is often preferred since it can better withstand high temperatures. The housing may also include a bottom. Such a bottom may be employed simply to seal the package, or it may be made of a thermally conductive material so that it acts as a heat sink.

The housing 12 also includes slots 18 in the wall, the slots 18 being open to the lower edge 14. The embodiment in FIGS. 1 and 2 herein shows six slots 18 in two opposing side portions of the wall. The slots 18 are provided to facilitate the connection of leads from an electronic component or components housed within the housing 12. The number of slots 18 will typically correspond to the number of leads from the housed component or components, although it is possible to provide other means (other components or circuit inside or outside of the housing) for electrically connecting or otherwise using certain leads of a component, while also providing the slots 18 for certain other of the leads.

The slots 18 may be shown in a somewhat exaggerated size, as the slots 18 may be of any suitable size, i.e., width and length, to facilitate the manufacture of the package, as described below. (In general, the slots may be in the range of 10–30 mils wide to accommodate wires from about 5–20 mils in diameter, and the slot may be kept at about twice the size of the wire diameter.) Indeed, the slots 18 may be small enough to simply accept the diameter of the lead 30 so that the flat portions of the lower edge 14 can be seated flush against a substrate. However, the slot is preferably longer in length to facilitate the manufacture of the package. There may also be a relatively close fit of the lead 30 within the slot 18 (and associated plating, if any is provided on the inside edge of the slot) such that when the leads 30 are positioned within slot 18, the same are held in place by an interference fit. -This enables the leads 30 to stay in place until the leads are electrically connected, by solder or otherwise, to the plating surrounding slot 18. This facilitates the manufacture of the package since it enables one to handle the partially prepared package towards completion of the package.

The slots 18 are plated with an electrically conductive material. Such plating preferably extends to the flat portions of the lower edge 14. The plating on the flat portions can be of any suitable size to enable the electrical connection of the package to a substrate. It may be prudent, however, and it is preferable to consider a size which would suit the circuit impedance, i.e., match as reasonably as possible the impedance of the circuit in connection with which the package housing will be used. In this manner, losses due to interconnection or interface can be minimized.

Figure 2:
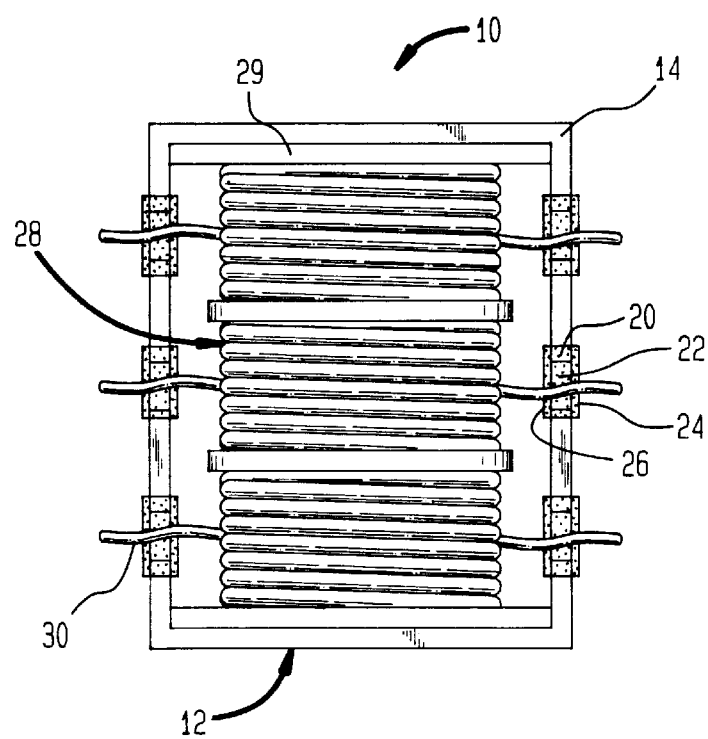
FIG. 2 is a bottom plan view of a surface mountable transformer package in accordance with the present invention.

FIGS. 2 and 3 show the lower edge plating 20 at flat portions adjacent to the slot 18, though as will be set forth in more detail below, the lower edge plating 20 can be at any flat portion of lower edge 14. It is also noted that the flat portions need not be part of the edge of the lower edge 14 of the housing 12, but may take on the form of the lower edge of a metal clip inserted into the slot after the lead of the component is inserted into the slot. The lower edge of such a clip thus provides the flat portion for connection to a substrate. Such an embodiment is discussed further below.

The inside edge of the slot 18 is also plated in the preferred embodiment, and this inside edge plating is generally designated as 22. The preferred embodiment also shows outer surface plating 24 and inner surface plating 26 in the areas of the wall surrounding the slots 18. FIGS. 2 and 3 show the lower edge 14 and the plating associated with the slots 18 and the flat portions of lower edge 14. Specifically, these figures show the lower edge plating 20, the inside edge plating 22, the outer surface plating 24 and the inner surface plating 26. It is noted that the thickness of the plating 24 and 26 has been exaggerated for illustration purposes. However, as one skilled in the art will recognize, plating is often in range of 0.5 to 5 mils, although any suitable thickness can be used.

While the preferred embodiment in FIGS. 1–3 show plating in all areas surrounding the slots 18, it is not necessary to plate all such areas. By way of example, the inside edge plating 22 and the lower edge plating 20 will suffice for providing an electrical connection from a lead of component to the lower edge plating, and the inside edge plating 22 need not even be all the way around the slot 18 so long as it is contiguous with or at least electrically connected to the lower edge plating 20.

Insofar as "plating" is called for herein, this term is to be construed to encompass electroless plating, spray painting of an electrically conductive paint, electroplating (which requires a conductive base plating such as an electroless plating), thin metal stampings (which can be made to form fit in and around the slots), a metal clip inserted into the slot to provide electrical connection from a lead of a component to a PC board, any combination of the above, or any other suitable manner in which the flat portions of the lower edge 14 and particular wall portions surrounding slot 18 may be metallized with an electrically conductive material. Thus, the "plating" can be in the form of a transmission line, a deposited or etched line which has no structure independent or apart from the housing wall, or a clip or other structure attached to the housing wall. The former type of plating— i.e., plating which has no independent structure—is referred to as "surface plating."

Figure 3A:
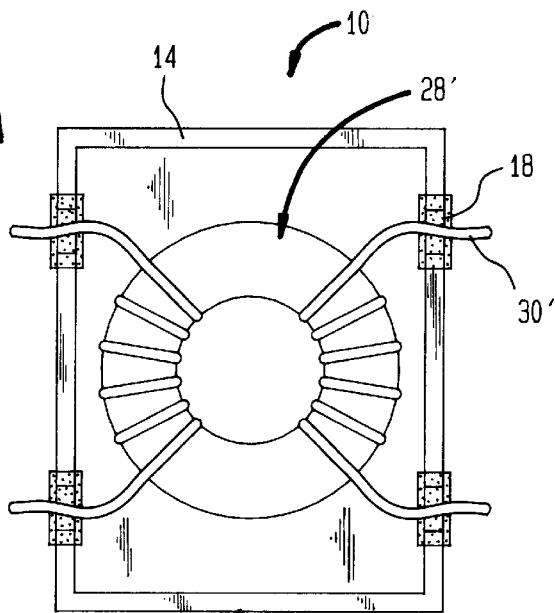
FIG. 3A is a bottom plan view of a surface mountable transformer package in accordance with another embodiment of the present invention, illustrating in particular the housing of a toroidal transformer and revealing that the present invention can be practical with various components.
Figure 3B:
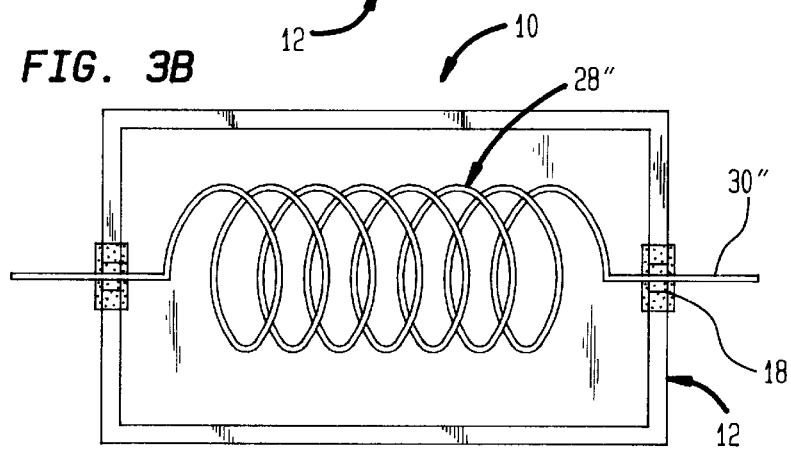
FIG. 3B is a bottom plan view of a surface mountable balun transformer package in accordance with another embodiment of the present invention, illustrating in particular the housing of an "air coil"
Figure 3C:
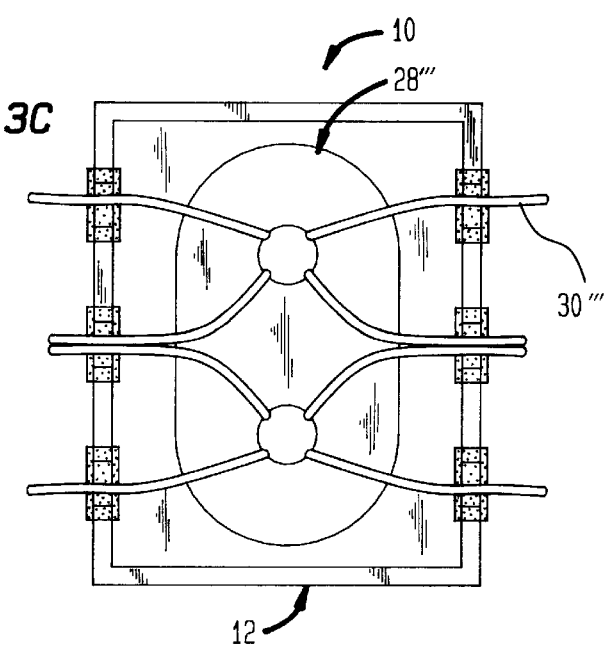
FIG. 3C is a bottom plan view of a surface mountable transformer package in accordance with another embodiment of the present invention, illustrating in particular the housing of a transformer having two "donut holes"

The package 10 includes, within the housing 12, an electronic component 28 as shown in FIG. 2, component 28' as shown in FIG. 3A, component 28" as shown in FIG. 3B, or component 28''' as shown in FIG. 3C. Of course, the components in the figures are for illustrative purposes only. Any electronic component or group of electronic components having at least one lead can be housed in the housing 12 and can form a package 10 in accordance with the present invention.

Thus, FIG. 2 illustrates a transformer having six leads designated as 30, three on each side of the housing 12. See also FIG. 1, illustrating the leads 30 as disposed and fixed within the slots 18. FIG. 3A illustrates a toroidal transformer having four leads 30'. The leads 30' are also disposed in the slots 18 of the housing 12. FIG. 3B illustrates an "air coil" 28" supported only by its leads 30" as connected within the slots 18 of the housing 12. FIG. 3C illustrates a transformer 28''', built around a balun having two donut holes and having its leads 30''' disposed in the slots 18 of the housing 12.

The components 28 and 28' illustrated in FIGS. 2 and 3, respectively, are transformers or, more generally, components with more than one winding of a conductive wire. The present invention possesses many advantages which are particularly pertinent with respect to the packaging of transformers and other miniaturized components having windings of delicate and difficult to handle wire. However, the present invention is not so limited. The present invention has numerous advantages which are applicable to all components. For instance, the present invention results in a versatile electronic component package which can be used in numerous ways; the present invention avoids excessive lead length, and in fact provides for uniform lead lengths because the component can be spaced within the housing and utilizes the slots in the housing which will be close to the component, the uniformity of the lead lengths being repeatable; the present invention provides an electronic component package in which the electronic component is stabilized; the present invention provides an electronic component package which minimizes the possibility of damage to the component itself or the leads of the component; the present invention provides an electronic component package which is easier to handle, and thus is ideal for high volume production where pick and place processes are used; the present invention provides an electronic component package where performance is not sacrificed; and the present invention provides an electronic component package having insulation properties which are advantageous for many applications.

The component 28 can be held within the housing 12 to stabilize the component with respect to the housing 12 to thereby guard against the fracture of the delicate, difficult to handle leads 30. This can be accomplished in any suitable manner. For instance, the interior of the housing 12 can be sized and shaped to the size and shape of the component 28 such that an interference fit results between the component and the housing. FIG. 2 illustrates an interference fit between the component 28 and the housing 12. The component frame 29 positions the component within the housing between the walls of the housing and perhaps from the top as well (though such spacing is not shown).

Figure 7:
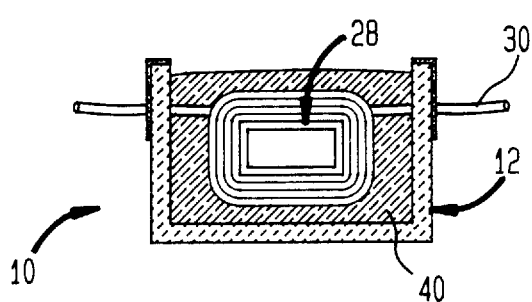
FIG. 7 is a cross-sectional view of a package in accordance with the present invention, illustrating an embodiment in which an encapsulant is used to encapsulate the component within the housing.

Another way in which the component can be held in the housing is by an adhesive. Yet another way would be to provide a structure on the inner surface of the housing 12 which would accommodate the component 28 and hold the same in place, with or without a fastener. Still another way would be to encapsulate the component within the housing 12, as is shown in FIGS. 7 and will be discussed further below. Any means are suitable, as long as the component is stabilized within the housing 12 and the leads 30 remain in tact. Even in situations where the leads 30 are not delicate, it may be desirable to stabilize the component so that there is not excessive movement of the component within the housing or excessive movement at the electrical connection between the leads 30 and the plating on the housing, as such electrical connection might break even if the leads are not delicate. The degree of stabilization required may vary— some components or the particular application may require a very secure stabilization, while others may require very little stabilization. Of course, there may be situations in which stabilizing the component is not necessary at all.

Figure 4:
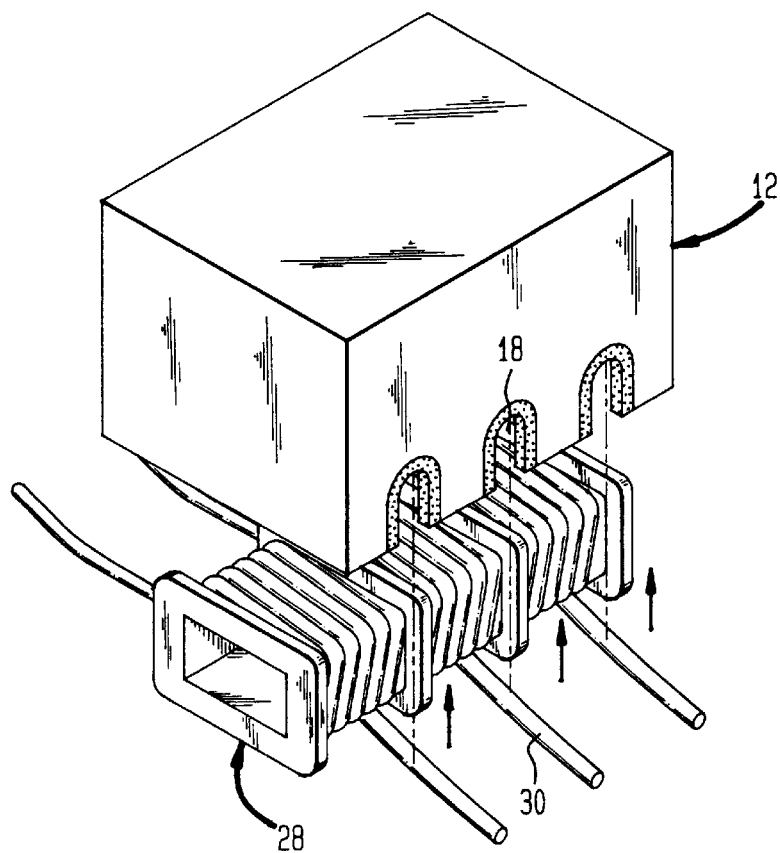
FIG. 4 is a perspective view of a transformer and a transformer housing, illustrating in particular the manner in which the transformer is to be mounted in the transformer housing in accordance with the present invention.

FIG. 4 illustrates the manner in which the component 28 and the housing 12 are brought together. The component 28 is arranged, below in this illustration, the housing 12, and the leads 30 are aligned with the slots 18. This step takes place after selecting the proper sized housing for the component. This selection process may be based on several factors. The number of leads and number of slots should correspond, unless another arrangement is being made for the connection or use of a lead, or a slot is being left open so that an outside component or vertically stacked component (discussed below) may be used subsequent to manufacturing the package 10.

Another factor to consider is the extent to which the package 10 will be customized. For instance, the lower edge plating 20 on the flat portion of the lower edge 14 may be in a particular pattern to match a particular pattern on a PC board, as opposed to being aligned only at locations adjacent to the slots 18. See, for instance, FIG. 6A and FIG. 6B, which will be discussed below. (of course, depending upon the component to be housed and the application for which the package may be used, the slots 18 can also be arranged with adjacent lower edge plating to provide a particular pattern.)

Yet further consideration might be given to whether the component 28 will be held within the housing 12, and if so how it will be held. If it is to be held by an interference fit, the selection of the housing 12 must be made accordingly. Consideration may also be given to whether a component should be spaced at a particular location within the housing 12 and/or from the substrate on which the package will be mounted, and thus whether spacers might be needed to position the component at the appropriate location within the housing 12 and with respect to the plating on housing 12.

Once the leads 30 are arranged so that they correspond with the slots 18, the leads are positioned within the slots and the component 28 is inserted into the housing 12. As can be appreciated, the steps of arranging the leads, positioning the leads within the slots and inserting the component into the housing can be accomplished in any suitable order. For instance, the component might be inserted into the housing first, with the leads 30 in positions so that they do not interfere with such insertion. The leads 30 can subsequently be arranged with respect to and positioned within the slots. Also, it is noted specifically that even though FIG. 4 shows the component 28 below the housing 12, the spatial and positional relationship of the parts during assembly does not matter to the final product.

Once the leads 30 are positioned in the slots 18 adjacent to a plated area around the slots 18, the leads 30 are electrically connected to that adjacent plating. As set forth above, that plating might be on only a portion of the inner edge of the slot, the outer surface of the wall, the inner surface of the wall, the flat portion of the lower edge 14, or any combination of these locations. The electrical connection can be made in any suitable manner. Preferably, a soldering process, whether it be hand soldering or a solder reflow process, should be employed to connect the leads 30 to the plated areas around the slots 18.

There are other ways in which the lead 30 can be connected to the plating. For instance, a metal clip which slides within or around slot 18 might be provided to hold the lead 30 in position against the plating, to thereby electrically connect the lead to the plating. This clip may be used simply to hold the lead in place for a soldering or other connecting process, and in such a situation it need not be metal. Also, this clip may be the same as the clip discussed earlier which provides the "plating" for a non-plated slot or provides a portion of the plating for a partially plated slot. Indeed, the slot can be surface plated by, for instance, electroplating and that surface plating can extend to along the wall of the housing to the location of a clip. Thus, the clip need not be in the area of the slot at all, as long as it is electrically connected to the clip via surface plating on the wall of the housing. Also, the slot need not be plated at all if an appropriate clip is used within the slot. In this latter arrangement, the clip can be used with or without soldering. Preferably, however, for the stabilization of the lead 30 and to ensure electrical connection, soldering should be used.

Once the component is within the housing 12 and the leads are electrically connected to the plating, the package 10 is ready for assembly to any substrate, such as a PC board. As noted above, the package 10, being surface mountable and having stabilized the component, is particularly suitable for high volume production in which pick and place assembly of PC boards is prevalent. The component can thus be picked and placed on a PC board with less chance of damage to the component and in particular the leads of the component.

Figure 5:
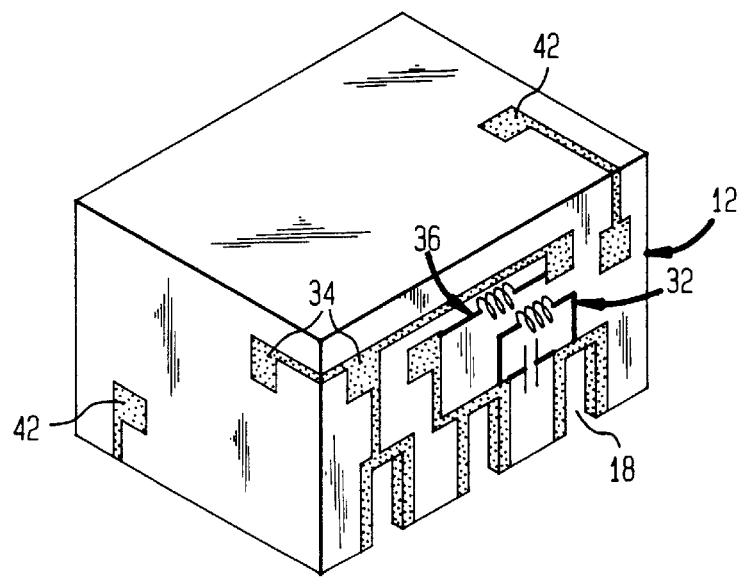
FIG. 5 is a perspective view of a transformer housing in accordance with another embodiment of the present invention, illustrating in particular the vertical stacking of components from the plated slots and the vertical integration of conductor patterns and components on different portions of the wall of the housing and on the top of the housing, some patterns arranged in association with the plated slots and other arrangements being independent of the plated slots.

FIG. 5 illustrates two additional embodiments of the present invention. First, it illustrates the stacking of additional components along the vertical wall of housing 12. Here, actual components, designated generally as 32, are connected to the plating between slots 18, and are stacked one upon the other. By this arrangement, the valuable "real estate" on a PC board is preserved as components and circuits are arranged vertically. In this regard, the vertical wall of the housing 12 facilitates the stabilization of stacked components 32.

FIG. 5 also shows the surface plating of the wall and top of the housing 12. The side portion of the wall which carries the slots 18 includes surface plating, as does the adjacent wall. This additional surface plating, generally designated as 34, can be as simple as being connected to the plating around slots 18 or as involved as providing for additional circuitry. Components such as component 36 shown in FIG. 5, can be connected to portions of the additional surface plating 34 in any suitable arrangement. The additional surface plating 34 can also be used to connect other components on the PC board to the housed component or to the other independent components or circuits. It is noted that FIG. 5 illustrates the additional surface plating 34 in no particular arrangement. The arrangement can be of any kind or type. Once again, the additional surface plating 34 on the walls and top of the housing 12 facilitates an efficient use of the "real estate" on a PC board.

It is noted that the additional surface plating 34 need not be connected in any way to the plating around slot 18. In this regard, FIG. 5 also illustrates the provision of an independent surface plating 42, one pattern of which extends upwardly from the lower edge of the housing 12 at one of the side portions of the walls, and another pattern of which extends from one wall to the top of the housing 12. In the latter arrangement, there is no connection to the lower edge of the housing 12. However, in the former arrangement, the independent surface plating 42 extends from the lower edge and may be on the lower edge itself so that the plating on the lower edge can be connected to a circuit, other surface plating or other component or transmission line on a substrate. By providing these arrangements, the independent plating 42 is available for use along the vertical wall of housing 12 and/or on the top of housing 12 for a component or series of components.

Although not shown, the interior of the housing can also be surface plated to facilitate the construction of circuitry inside the housing or to facilitate the connection of the housed component to other components or circuitry outside of the housing. This interior surface plating can also be electrically connected with the slots 18 or any portion of them, or might even be electrically connected to the surface plating on the exterior of the walls or the top, by perhaps a plated through-hole in the wall or the top.

The vertical stacking of components, such as stacked components 32, and the vertical integration of additional circuitry or components via additional surface plating 34, exemplify the versatility of the housing 12 and/or the package 10. The vertical stacking and/or the vertical integration may be customized for particular applications or provided in standard patterns so that the package 10 or the housing 12 can be used in a variety of ways and for a variety of applications, all at the option of user.

Figure 6A:
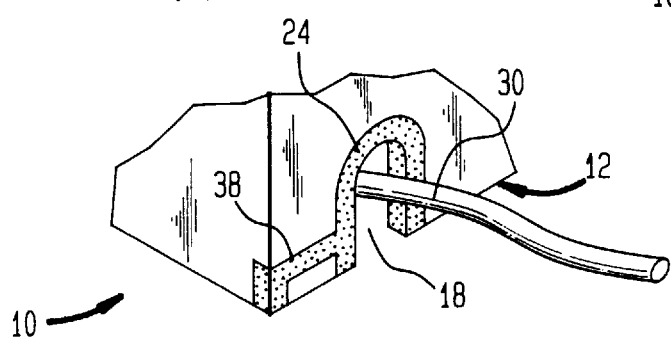
FIG. 6A is a partial perspective view of a package in accordance with another embodiment of the present invention, illustrating in particular an embodiment by which the plating on the flat portions of the lower edge of the housing is remote from the opening.
Figure 6B:
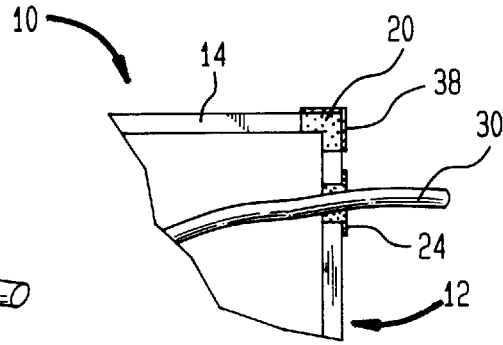
FIG. 6B is a partial bottom view of the package in FIG. 6A.

FIGS. 6A and 6B illustrate an embodiment by which the plating on the flat portion of the lower edge 14, again designated as 20, is at a location which is remote from the slot 18. To accomplish this, in the embodiment illustrated in FIGS. 6A and 6B, the outer surface plating 24 and the wall plating 38 are connected to the lower edge plating 20 via wall plating 38. As with previous embodiments, in FIG. 6B, the thickness of the wall plating 38 has been exaggerated for purposes of illustration.

The arrangement shown in FIGS. 6A and 6B is particularly advantageous for the preparation of the housing 12 which is to be used in a particular application, i.e., on a particular PC board. Thus, if it is known that the connections to the PC board will be made at, for example, the four corners of the housing 12, the lower edge plating 20 can be arranged to accommodate that PC board, regardless of the component housed within the housing 12. Also, the plating shown in FIGS. 6A and 6B need not be all surface plating. The slot and the horizontal plating may be surface plating, and a clip could be used at the corner to bring the electrical connection to a flat portion for connection to a substrate, the flat portion being part of the clip itself.

FIG. 7 illustrates the encapsulation of the component 28 as mentioned above. Thus, FIG. 7 shows a cross-section through a package 10 in which the component 28 has been encapsulated by an encapsulation material 40. Such encapsulation is provided for many reasons, including for insulation, and for the stabilization of the component and the leads 30. The encapsulation material 40 can be any suitable encapsulation material having dielectric properties. Preferably, the encapsulation material is an epoxy resin having certain characteristics including electrical and mechanical properties that provide a low loss tangent, a low dielectric constant, strong adhesion to the circuit board and electrical components thereon, and sufficient tensile strength and density to mechanically stabilize the components and wiring of the circuit. Preferably, such material is an epoxy resin such as Ricotuff, Ricotuff LV, Ricotuff RB, or a combination thereof, manufactured by Ricon Resins, Inc., of Grand Junction, Colorado. More preferably, the material used is Ricotuff LV at low viscosity.

The encapsulation shown in FIG. 7 surrounds the component 28 entirely. However, it may not be necessary or desirable to fully encapsulate a component within the housing, and thus partial encapsulation may also suffice for many purposes and applications. Preferably, the encapsulation material 40 is injected into the housing 12 after the component 28 is inserted into position and the leads 30 are electrically connected to the plating surrounding the slots 18, though this particular order is not necessary.

When a packaged component is mounted on a PC board, the solder joint is often inspected by quality control. With surface mount packages this inspection can be difficult since the solder joint may be hidden or partially hidden. One way in which to provide visibility or inspection is to raise the package slightly so that the solder joint can be seen. In the present case, a lead frame may be used to raise the housing from the substrate.

Figure 8:
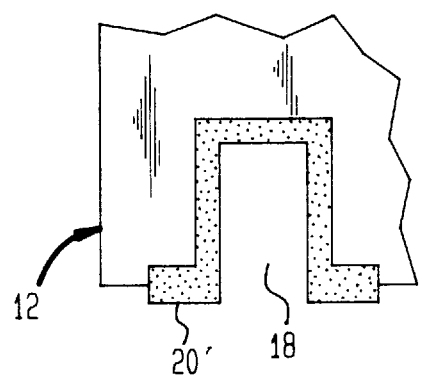
FIG. 8 is a partial side elevational view of a package housing in accordance with another embodiment of the present invention, illustrating in particular the plating on the housing, for example electroplating, in increased thickness on the lower edge of the housing wall so that the package is raised when mounted on a substrate.

Another way in which to facilitate inspection of the solder joint to provide additional plating at the lower edge of the housing wall. This can be accomplished by providing a greater thickness of surface plating. As shown in FIG. 8, the housing 12 includes a plated slot 18, in this case surface plated. At the lower edge of the housing, the lower edge plating has considerable thickness such that it is an elevating lower edge plating, designated as 20'. The elevating lower edge plating 20' raises the housing sufficiently to facilitate the inspection of the solder joint between the package and the substrate.

Figure 9:
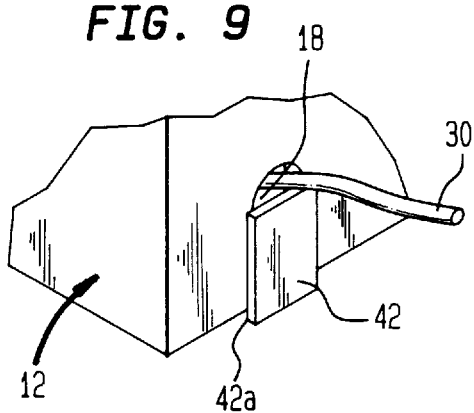
FIG. 9 is a partial perspective view of a package housing in accordance with another embodiment of the present invention, illustrating in particular the use of a clip in the area of the slot, whereby the bottom edge of the clip is lower than the lower edge of the housing wall so that the package is elevated when it is connected to a substrate (unlike in other embodiments where the clip is flush with the lower edge)

FIG. 9 illustrates the use of a clip 42 which is made of conducting material. In this embodiment, the lower edge 42a of the clip 42 is lower than the lower edge 14 of the housing 12. This lower edge 42a of the clip 42 also raises the housing 12 to facilitate the inspection of the solder joint. Also, as shown in FIG. 9, the clip 42 does not fully close the slot 18, but rather leaves the top portion open, and it is through this opening that the lead 30 is disposed. As noted above, the slot 18 may or may not be plated. Where the slot is not plated, an electrical connection is made directly between the lead 30 and the clip 42. Also as noted above, the clip 42 need not be in the area of the slot. Instead, the clip 42 can be electrically connected to the lead 30 via surface plating extending from the slot 18 to the location of the clip 42.

Figure 10:
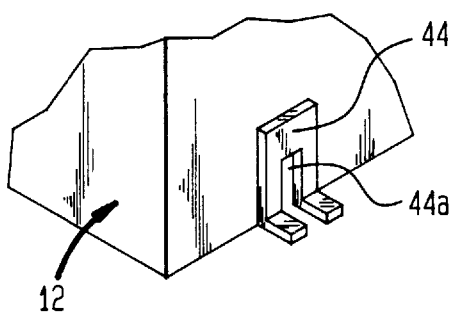
FIG. 10 is a partial perspective view of a package housing in accordance with another embodiment of the present invention, illustrating in particular a clip associated with the housing which provides a slot and feet on either side of the slot so that the connection between the package and the substrate is visible without raising the package from the substrate.

The present invention is also particularly suited for facilitating the inspection of the solder joint between the package and the PC board without raising the housing 12 from the PC board. To accomplish this, a slotted clip 44, shown in FIG. 10, is provided in the area of the slot in the housing 12. The slotted clip 44 includes a slot 44a and two small feet 44b. The slot 44a leaves the slot 18 fully or partially exposed. The feet 44b are preferably quite small, but large enough to provide an electrical connection to a PC board via a solder joint, whereby the solder joint is visible without raising the housing 12. As with clip 42, the slotted clip 44 is preferably made of an electrically conductive material so that it need not be. The advantage of the slotted clip 44 is that the housing 12 can come assembled with that slotted clip in place, and the method of manufacturing a package in accordance with the present invention can be practiced. In this regard, the slotted clip 44 may be applied without the feet 44B, and so that its bottom edge is flush with the lower edge 14 of the housing 12, or extends beyond the lower edge 14 of the housing 12 to raise the housing as discussed above.

Figure 11:
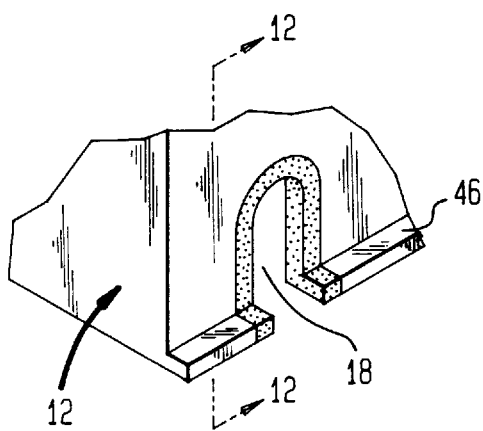
FIG. 11 is a partial perspective view of a package housing in accordance with another embodiment of the present invention, illustrating in particular a foot portion at the bottom of the housing wall, such foot being plated so that the connection between the package and a substrate is visible without elevating the package.

FIG. 11 illustrates a housing 12 having an integral foot portion 46. This foot portion is exaggerated in size, as it is preferably very small, but again large enough to provide an electrical connection via a solder joint which can be inspected without raising the housing 12. Also, although the foot 46 is shown as continuous along the slotted wall of the housing 12, it may be provided only in the area of the slot, or at an area remote from the slot with surface plating extending from the slot, and thus the lead of the component, to the foot. The foot 46 is plated, preferably surface plated and joins with the plating on the slot 18. FIG. 11 shows plating in all areas around the slot 18 and the adjacent area of the foot 46.

Figure 12:
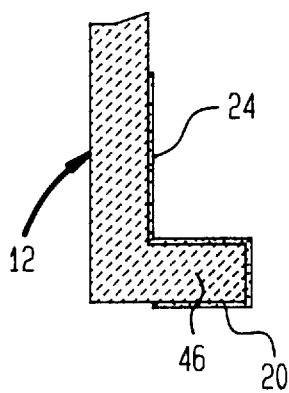
FIG. 12 is a cross-sectional view of the package housing shown in FIG. 11, illustrating in particular the foot at the bottom of a housing wall and the plating of the foot.

FIG. 12 shows a cross-section along the slotted wall of the housing 12, and illustrates the plating around the slot 18 in the housing 12 and around the foot 46.

While the foregoing description and figures illustrate some preferred embodiments of the component package in accordance with the present invention, it should be appreciated that certain modifications may be made and are encouraged to be made in this structure, arrangement and materials of the disclosed embodiments without departing from the spirit and scope of the present invention which is defined by the claims which are set forth below.

We claim:

1. A surface mount package comprising:
   a. a housing having an interior for receiving an electronic component and having a wall, at least said wall being made of a dielectric material, said wall having a bottom edge and an opening at said bottom edge for receiving a lead from a component housed within said housing, said housing having a flat lower edge, said flat lower edge having at least one portion which is plated with a conductive material; and
   b. at least one electronic component housed within said housing and including a lead, said lead being electrically connected to said conductive material on said flat lower edge of said housing and said connection being made in said opening such that said flat lower edge can rest flush on a substrate, whereby said electronic component can be electrically connected to a circuit or component on such substrate, wherein said wall of said housing includes surface plating.

2. The package in claim 1, wherein said surface plating on said wall is electrically connected to said plating at said flat lower edge.

3. The package in claim 1, wherein said housing includes a top, and said top includes surface plating.

4. The package in claim 3, wherein a component or components are electrically connected to the surface plating on said top of said housing, and are supported by said top of said housing and such connections.

5. The package in claim 1, wherein an electronic component or components are electrically connected to said surface plating, and are supported by such connections.

6. A surface mount package comprising:
   a. a housing having an interior for receiving an electronic component and having a wall, at least said wall being made of a dielectric material, said wall having a bottom edge and an opening at said bottom edge for receiving a lead from a component housed within said housing, said housing having a flat lower edge, said flat lower edge having at least one portion which is plated with a conductive material; and
   b. at least one electronic component housed within said housing and including a lead, said lead being electrically connected to said conductive material on said flat lower edge of said housing and said connection being made in said opening such that said flat lower edge can rest flush on a substrate, whereby said electronic component can be electrically connected to a circuit or component on such substrate, wherein said flat lower edge is plated at a portion which is remote from said opening.

7. The package in claim 6, wherein said wall is plated from said opening, at which said wall plating is electrically connected to said lead of said electronic component, to the plating at said flat lower edge, at which said wall plating is electrically connected to the plating at said flat lower edge.

8. The package in claim 7, wherein at least the plating from said opening to said flat lower edge is surface plating.

9. The package in claim 8, wherein the plating at said flat lower edge is provided by a clip attached to said housing.

10. A surface mount package comprising:
    a. a housing having an interior for receiving an electronic component and having a wall, at least said wall being made of a dielectric material, said wall having a bottom edge and an opening at said bottom edge for receiving a lead from a component housed within said housing, said housing having a flat lower edge, said flat lower edge having at least one portion which is plated with a conductive material; and
    b. at least one electronic component housed within said housing and including a lead, said lead being electrically connected to said conductive material on said flat lower edge of said housing and said connection being made in said opening such that said flat lower edge can rest flush on a substrate, whereby said electronic component can be electrically connected to a circuit or component on such substrate, wherein said opening is at least partially defined by an opening edge which is contiguous with said flat lower edge of said wall, and said opening edge is at least partially plated such that the plating on said opening edge is electrically connected to the plating on said flat lower edge, wherein said housing is sized with respect to said at least one electronic component so that said component is held within and stabilized with respect to said housing by an interference fit via contact with the interior surface of said housing.

11. The package in claim 10, wherein said component is at least partially encapsulated by a low dielectric compound within said housing.

12. The package in claim 10, wherein said component is at least partially encapsulated by a low dielectric compound within said housing.

13. A surface mount package comprising:
    a. a housing having an interior for receiving an electronic component and having a wall, at least said wall being made of a dielectric material, said wall having a bottom edge and an opening at said bottom edge for receiving a lead from a component housed within said housing, said housing having a flat lower edge, said flat lower edge having at least one portion which is plated with a conductive material, wherein the plating at said flat lower edge is provided by a clip attached to said housing and
    b. at least one electronic component housed within said housing and including a lead, said lead being electrically connected to said conductive material on said flat lower edge of said housing and said connection being made in said opening such that said flat lower edge can rest flush on a substrate, whereby said electronic component can be electrically connected to a circuit or component on such substrate, wherein said opening is at least partially defined by an opening edge which is contiguous with said flat lower edge of said wall, and said opening edge is at least partially surface plated such that the plating on said opening edge is electrically connected to the plating on said flat lower edge.

14. The package in claim 13, wherein said wall of said housing includes extensions extending outwardly therefrom.

15. The package in claim 13, wherein said at least one electronic component housed within said housing is a coil-type device having windings of delicate wire.

16. The package in claim 15, wherein said at least one electronic component is a transformer.

17. The package in claim 13, wherein said at least one electronic component is held within said housing such that it is stabilized with respect to said housing.

18. A surface mount package comprising:
    a. a housing having an interior for receiving an electronic component and having a wall, at least said wall being made of a dielectric material, said wall having a bottom edge and an opening at said bottom edge for receiving a lead from a component housed within said housing, said housing having a flat lower edge, said flat lower edge having at least one portion which is plated with a conductive material; and b. at least one electronic component housed within said housing and including a lead, said lead being electrically connected to said conductive material on said flat lower edge of said housing and said connection being made in said opening such that said flat lower edge can rest flush on a substrate, whereby said electronic component can be electrically connected to a circuit or component on such substrate, wherein said opening includes an opening edge which is at least partially surface plated and said plating at said flat lower edge is provided by a clip attached to said housing.

19. The package in claim 18, wherein said clip is in electrical contact with said plating at said opening edge.

20. A surface mount package comprising:

a. a housing having an interior for receiving an electronic component and having a wall, at least said wall being made of a dielectric material, said wall having a bottom edge and an opening at said bottom edge for receiving a lead from a component housed within said housing, said housing having a flat lower edge, said flat lower edge having at least one portion which is plated with a conductive material; and b. at least one electronic component housed within said housing and including a lead, said lead being electrically connected to said conductive material on said flat lower edge of said housing and said connection being made in said opening such that said flat lower edge can rest flush on a substrate, whereby said electronic component can be electrically connected to a circuit or component on such substrate, wherein said plating at said flat lower edge is provided by a clip attached to said housing in the area of said opening.

21. The package in claim 20, wherein said clip does not fully cover said opening in said housing such that a space is left for said lead of said component.

22. The package in claim 20, wherein said clip covers said opening in said housing and includes a slot in which said lead of said component is disposed.

23. The package in claim 14, wherein said clip includes extensions extending outwardly from said wall of said housing.

24. A method of manufacturing a surface mountable package comprising the steps of:

a. providing a housing having an interior and a wall, at least the wall being made of a dielectric material, the wall having a bottom edge and an opening, the housing having a flat lower edge, the flat lower edge being plated with an electrically conductive material and the opening being at least partially plated with an electrically conductive material;

b. providing an electronic component having a lead;

c. arranging the housing and the electronic component with respect to one another such that the lead of the component is aligned with the opening in the wall of the housing;

d. inserting the electronic component into the interior of the housing;

e. positioning the lead in the opening;

f. electrically connecting the lead to the plated flat lower edge such that the plated flat lower edge can rest flush on a substrate and the electronic component can be electrically connected to a circuit or component on such substrate; and g. plating the wall of the housing at least in the area of the opening such that the lead of the component can be electrically connected from the opening to the flat lower edge of the housing.

25. The method in claim 24, wherein the plating at least in the area of the opening and the plating at the flat lower edge of the housing is surface plating.

26. The method in claim 25, wherein the bottom edge of the wall includes the flat lower edge of the housing, and the flat lower edge of the housing is adjacent to the opening.

27. The method in claim 26, wherein the flat lower edge is provided at least partially on an outward extension at the bottom edge of the wall.

28. The method in claim 25, wherein the flat lower edge of the housing is provided by a clip.

29. The method in claim 28, wherein the clip is attached to the wall of the housing in the opening, and the clip includes a slot.

30. The method in claim 29, wherein the clip includes an outward extension, and the flat lower edge is on at least a portion of that outward extension.

31. The method in claim 24, further including the step of connecting an additional component or components to surface plating on the wall of the housing.

32. The method in claim 31, including the step of connecting the additional component or components to the electronic component housed within the interior of the housing.

33. The method in claim 24, further including the step of at least partially encapsulating the housed electronic component with a low dielectric compound.

34. The method in claim 24, further including the step of stabilizing the housed component within the housing.

35. The method in claim 24, wherein the opening plating and the flat lower edge plating are contiguous with one another and thus electrically connected by the plating.

* * * * *

UNITED STATES PATENT AND TRADEMARK OFFICE
CERTIFICATE OF CORRECTION

PATENT NO. : 5,805,431
DATED : September 8, 1998
INVENTOR(S) : Joshi et al

It is certified that error appears in the above-identified patent and that said Letters Patent is hereby corrected as shown below:

Column 15, line 45, "14" should read --22--.

Signed and Sealed this

Twenty-ninth Day of December, 1998

Attest:

BRUCE LEHMAN

*Attesting Officer*     *Commissioner of Patents and Trademarks*